US006384550B1

(12) United States Patent
Miyakawa et al.

(10) Patent No.: US 6,384,550 B1
(45) **Date of Patent: *May 7, 2002**

(54) SPEAKER AND DRIVE DEVICE THEREFOR

(75) Inventors: Hideaki Miyakawa, Yokohama; Masaichi Satoh, Tokyo; Kenichi Nagasawa, Kawasaki; Reiji Mitarai, Hachioji, all of (JP)

(73) Assignee: Canon Kabushiki Kaisha, Tokyo (JP)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/524,407

(22) Filed: Sep. 6, 1995

(30) Foreign Application Priority Data

Sep. 6, 1994 (JP) ............................................ 6-212549

(51) Int. Cl.[7] ............................ H01L 41/08; H04R 3/00

(52) U.S. Cl. ......................... 318/116; 381/111; 381/96; 310/316.02; 310/323.06

(58) Field of Search .......................... 381/96, 165, 162, 381/111, 116; 310/316.02, 323.01, 323.04, 323.06, 323.03

(56) References Cited

U.S. PATENT DOCUMENTS

| | | | | | |
|---|---|---|---|---|---|
| 4,246,447 | A | * | 1/1981 | Vorie | 381/162 |
| 4,287,389 | A | | 9/1981 | Gamble | |
| 4,564,727 | A | * | 1/1986 | Danley et al. | 381/162 |
| 4,794,294 | A | | 12/1988 | Shimizu et al. | |
| 5,140,641 | A | * | 8/1992 | Danley et al. | 381/165 |
| 5,191,618 | A | * | 3/1993 | Hisey | 381/165 |
| 5,197,104 | A | * | 3/1993 | Padi | 381/96 |
| 5,245,296 | A | * | 9/1993 | Miller et al. | 381/96 |
| 5,402,502 | A | | 3/1995 | Boothroyd et al. | 381/160 |
| 5,418,336 | A | | 5/1995 | Negishi et al. | 181/155 |
| 5,461,273 | A | * | 10/1995 | Kawasaki et al. | 310/316.02 |
| 5,493,615 | A | * | 2/1996 | Burke et al. | 381/165 |
| 5,495,152 | A | * | 2/1996 | Fukui | 318/116 |
| 5,625,246 | A | * | 4/1997 | Suganuma | 310/316.02 |
| 5,625,263 | A | * | 4/1997 | Suganuma | 318/116 |
| RE35,852 | E | * | 7/1998 | Takagi | 318/116 |

FOREIGN PATENT DOCUMENTS

| | | |
|---|---|---|
| DE | 37 19 537 | 12/1987 |
| DE | 39 08 402 | 9/1990 |
| GB | 2 196 815 | 5/1988 |
| JP | 59156169 | 9/1984 |
| JP | 2 121 497 | 5/1990 |
| JP | 03289307 | 12/1991 |

OTHER PUBLICATIONS

M. Sugihara, et al., "Quick Response in Rotation of Ultrasonic Motor", Japanese Journal of Applied Physics, vol. 29, No. 29, pp. 197–199 (Jan. 1, 1990).

A. Kawamura, et al., "Linear Ultrasonic Piezoelectric Actuator", IEEE Transactions of Industry Applications, vol. 27, No. 1, pp. 23–26 (Jan. 1, 1991).

S. Ueha, "Present Status of Ultrasonic Motors", Proceedings of the Ultrasonics Symoposium, vol. 2, pp. 749–753 (Oct. 3–6, 1989).

* cited by examiner

*Primary Examiner*—Xu Mei
*Assistant Examiner*—Brian Pendleton
(74) *Attorney, Agent, or Firm*—Fitzpatrick, Cella, Harper & Scinto

(57) ABSTRACT

A sound signal from an audio amplifier is converted to a speed signal by a drive circuit, and a cone sheet which forms a diaphragm is driven by a supersonic wave motor driven by a travelling vibration wave through a link and a leaf spring.

9 Claims, 7 Drawing Sheets

SPEAKER AND DRIVE DEVICE THEREFOR

BACKGROUND OF THE INVENTION

1. Field of the Invention

The present invention relates to a speaker and a drive device therefor, and more particularly to a novel speaker which improves all defects of a so-called dynamic speaker and a drive device therefor.

2. Related Background Art

Most speakers currently used are so called dynamic speakers of electro-magnetic induction type and only limited high fidelity type speakers are of a static type.

The dynamic speaker has history of over eighty years and a basic principle thereof is based on an electro-magnetic induction phenomenon. Namely, when a current is produced in a magnetic field, a magnetic field is generated in accordance with an amount of current and a force results. A diaphragm of the speaker is driven by this force. In other words, when a sound current flows through a voice coil in a given magnetic field, a speaker motor is driven in accordance with Flemming's lefthand law.

FIG. 1 shows a schematic construction of the dynamic speaker of this type. Numeral 1 denotes an edge member and numeral 2 denotes a cone sheet. Those form a diaphragm plate. Numeral 4 denotes a spider, numeral 5 denotes a voice coil, numeral 6 denotes a magnet and numeral 7 denotes a housing. The voice coil 5 is hung in the housing by the spider 4. When a current flows through the voice coil 5 in accordance with the sound signal, the voice coil 5 is vibrated and the cone sheet 2 is vibrated thereby to reproduce sound.

However, the prior art speaker has the following defects.

(1) Counter emf of dynamic motor

As shown in FIG. 1, when the conductor or the voice coil 5 moves in the magnetic field, a counter action of the counter emf is naturally generated in accordance with Flemming's righthand law. The problem of the counter emf is combined with an impedance of the amplifier in a complex manner so that the linearity of the dynamic motor is damaged and the speaker is adversely affected. In a so-called ribbon type speaker which is a modification of the dynamic type, a similar problem occurs.

(2) Resonance phenomenon

A resonance frequency inherent to the speaker is determined by a mass of a movable part of the speaker and an equivalent mass when surrounding air is swung. A lowest resonance frequency which is normally referred to as $f_0$ indicates a lowest reproducible frequency of the speaker. Assuming that a sound input is a sine wave having a frequency $f_0$, the counter emf combined with the amplifier functions as an electrical damper but a disturbance of phase and a change in impedance result in and an overall input/output characteristic of the speaker is non-linear.

As shown in FIG. 1, the spider 4 and the edge member 1 attached to the housing 7 of the speaker link the movable parts such as the voice coil 5 and the cone sheet 2 to the main body. They function as a mechanical damper to serve to control Q at the resonance point (quality factor representing sharpness of resonance). However, the mechanism as the passive mechanical damper slows the overall response of the speaker. Such mechanical damper is designed from the overall consideration of the control of Q, the control of residual vibration, the response characteristic and the linearity.

(3) Group delay phenomenon

The sound signal is normally processed as a voltage signal. Voltages in a voltage range from a voltage of mV order produced by a microphone to a voltage of several volts inputted to a main amplifier do not cause a phase shift in the voltage amplification. However, since the main amplifier drives the speaker, it outputs a power or (voltage×current). When the dynamic speaker is driven by the output of the main amplifier, a low frequency sound delay phenomenon called a group delay phenomenon takes place. Simply, when the sound input is inputted to the main amplifier from the microphone output, the waveforms are the same and only the voltages are different. On the other hand, the sound output from the dynamic speaker is reproduced with more delay as the frequency becomes lower and the reproduced sound may be far from the original sound waveform.

In order to solve the above problem, it may be possible to match gains at the respective frequencies by using a Fourier transform but it is mere averaging on a time axis. It is impossible, in principle, to reproduce the original sound waveform as it is by the prior art dynamic speaker. On the other hand, it has been reported that human audible sense more sensitively senses phase information as the sound frequency is lower. In general, it is considered that the phase information of the sound of up to 1.5 KHz may be discriminated. Accordingly, it is considered that the discrimination ability is higher as the sound frequency is lower and it may be said that the group delay characteristic is a fatal defect that the prior art speaker possesses.

SUMMARY OF THE INVENTION

It is an object of the present invention to provide a novel speaker which solves defects that the prior art speaker possesses.

In order to achieve the above object, the speaker of the present invention adopts a construction to drive a diaphragm by a vibration wave motor which is driven by a travelling vibration wave. In a preferred embodiment to implement the invention, a conversion circuit for converting a sound signal to a velocity signal related to a velocity of the vibration wave motor is provided and the vibration wave motor is driven in accordance with the velocity signal from the conversion circuit.

By the above arrangement, a counter emf is not generated because the vibration wave motor does not use the electromagnetic induction. Since the vibration wave motor has a large mass relative to the movable part and contact-drives it, a static friction coefficient is large and no resonance phenomenon takes place. Further, because of voltage drive, no group delay phenomenon takes place. Accordingly, a speaker of an excellent low frequency characteristic or high fidelity is provided.

DETAILED DESCRIPTION OF THE PREFERRED EMBODIMENTS

Embodiments of the present invention are explained with reference to the accompanying drawings.

Figure 1:
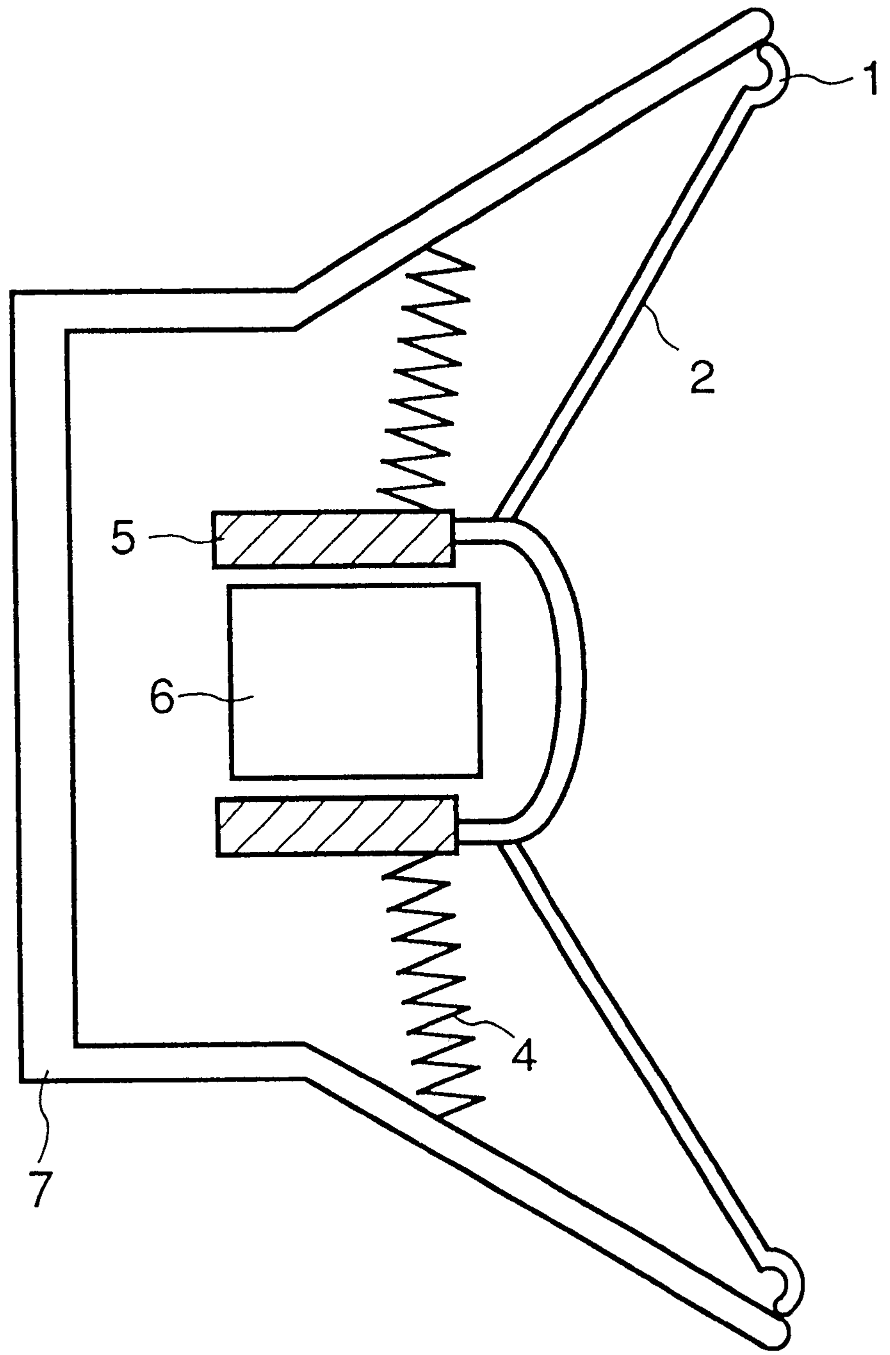
FIG.1 PRIOR ART
FIG. 1 shows a schematic construction of a prior art dynamic speaker.
Figure 2:
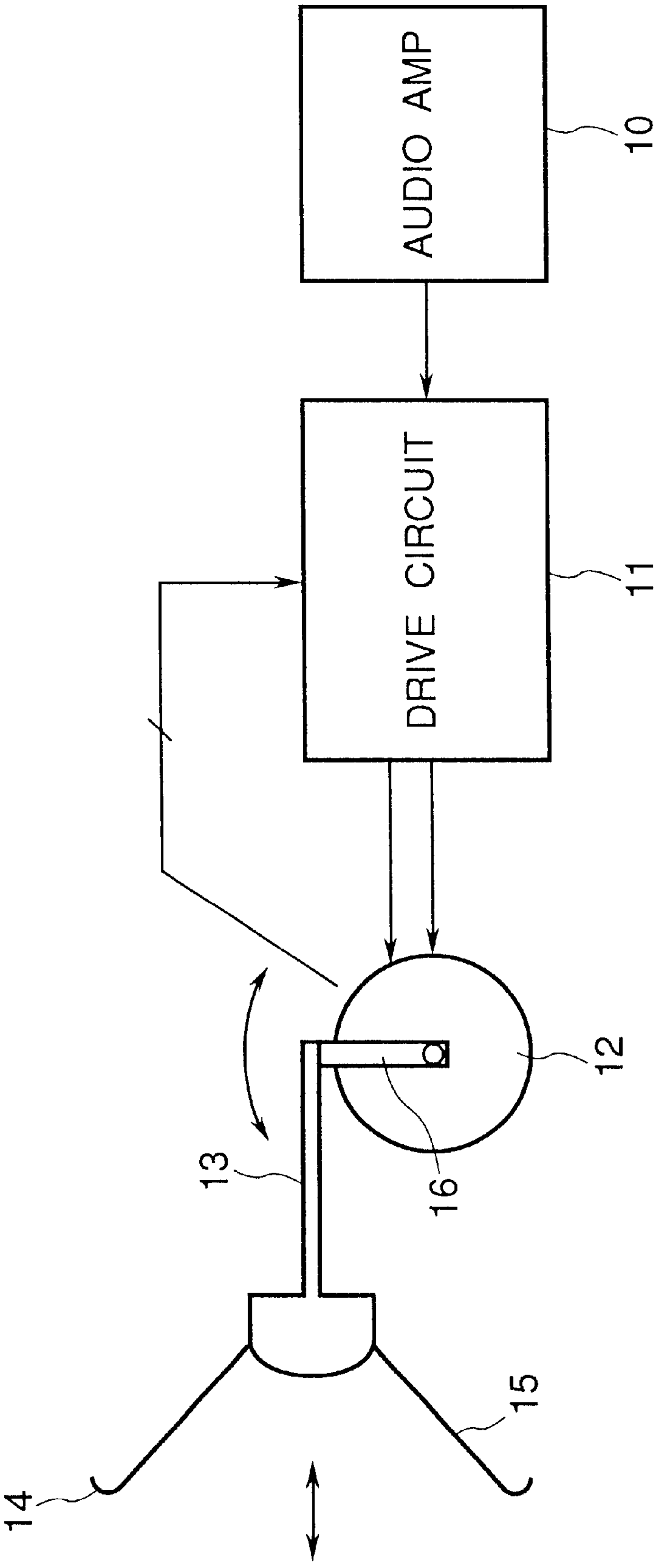
FIG. 2 shows a schematic construction of a speaker in accordance with one embodiment of the present invention.

FIG. 2 shows a schematic construction of a speaker in accordance with an embodiment of the present invention. Numeral 10 denotes an audio amplifier as a source for generating a sound signal and the sound signal outputted from the amplifier 10 is supplied to a drive circuit 11. The drive circuit which is described later converts amplitude information of the sound signal to a travelling wave frequency or amplitude information to drive a supersonic motor 12 and supplies drive signals of different phases (for example, by 90 degrees) generated by the frequency and the amplitude information to a pair of transformers.

The supersonic motor 12 is of a rotation type and has an absolute rotary encoder for outputting phase information indicating an absolute value of a rotation phase (rotation angle). The phase information outputted by the encoder is fed back to the drive circuit 11 to contribute to the determination of the frequency and the amplitude information. The supersonic wave motor 12 is thus driven such that it has a rotation phase corresponding to the amplitude of the audio signal outputted from the audio amplifier 10.

In FIG. 2, numeral 16 denotes a rotating link coupled to a center of a disk member coupled to a rotor of the supersonic wave motor 12. A leaf spring 13 for transducing the rotating motion of the supersonic wave motor 12 to a linear motion is coupled to one end of the link 16. The leaf spring 13 is coupled to a cone sheet 15 of a diaphragm. Numeral 14 denotes an edge member for coupling and fixing the cone sheet 15 to a speaker housing, not shown. While not shown, the supersonic wave motor 12 itself is fixed to a housing which is fixed to the edge member 13 by a mechanism, not shown.

Figure 3:
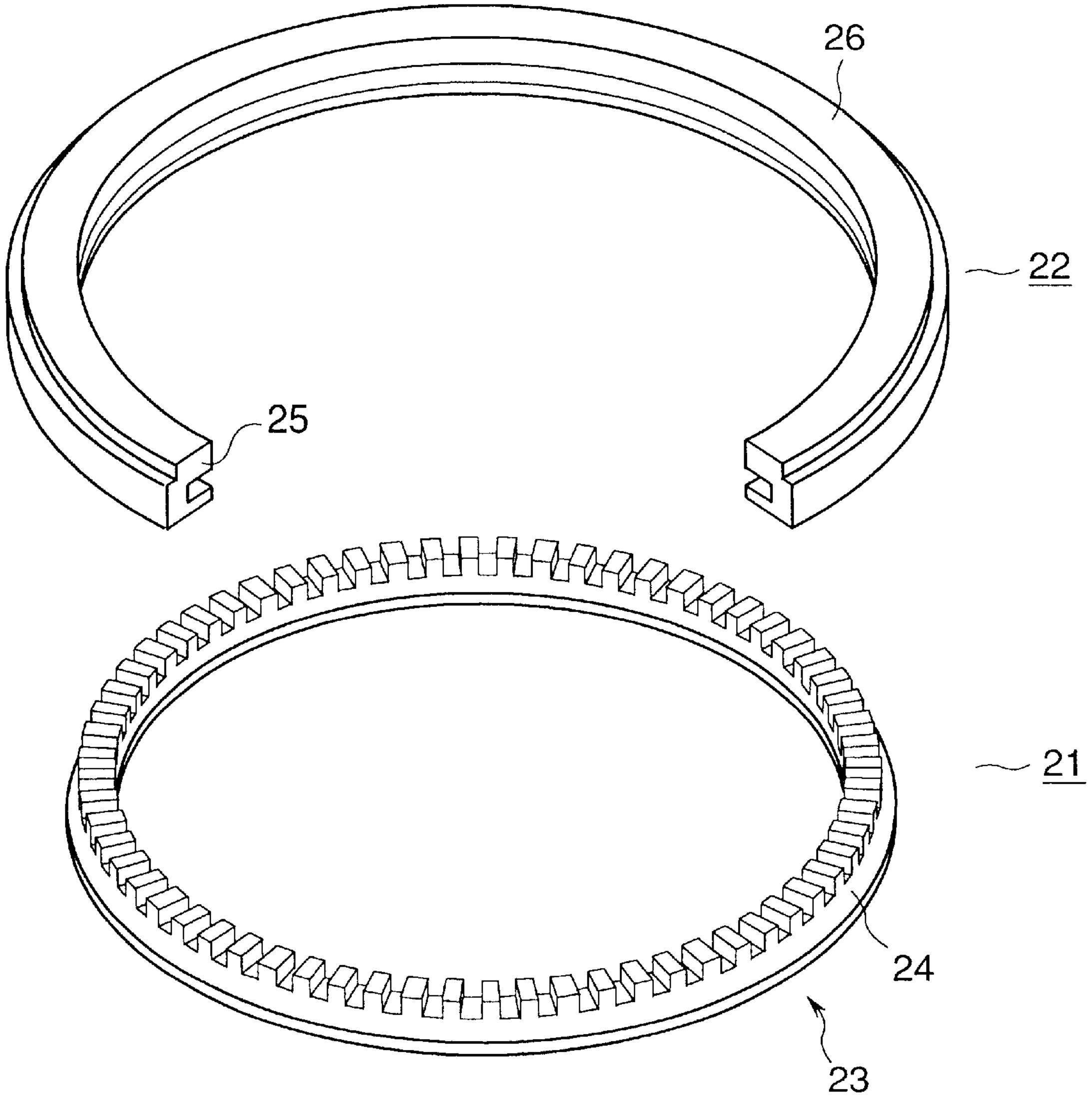
FIG. 3 shows a construction of a supersonic motor used in the speaker of FIG. 2.

The supersonic motor 12 may be a motor disclosed in Japanese Laid-Open Patent Application No. 59-156169 filed by the assignee of the present invention, and a schematic construction thereof is shown in FIG. 3. Numeral 21 denotes a stator and numeral 22 denotes a rotor. The stator 21 comprises a piezo-electric ceramic 23 and a metal ring (elastic member) 24 which drives the rotor main unit (vibration member) 26 through a flange-like spring 25.

The piezo-electric ceramic 23 has a number of electrodes having a length corresponding to a ½ wavelength and a number of electrodes having a length corresponding to a ¼ wavelength arranged alternately. Travelling wave signals having a phase difference of 90 degrees are supplied to a transformer coupled to two types of electrodes of the piezo-electric electrode to drive the piezo-electric ceramic 23. As the piezo-electric ceramic 23 is driven, a metal ring 24 is also excited to cause an elliptic motion at apexes of a number of projections formed on the metal ring 24.

The elliptic motion causes a flange-shaped spring 25 to be rotated in a predetermined direction and the rotation is transmitted to a rotor main body 26 so that the rotor main body 26 is rotated. A disk member is coupled to the rotor 26 and the link 16 and leaf spring 13 are driven through the disk member.

Figure 4:
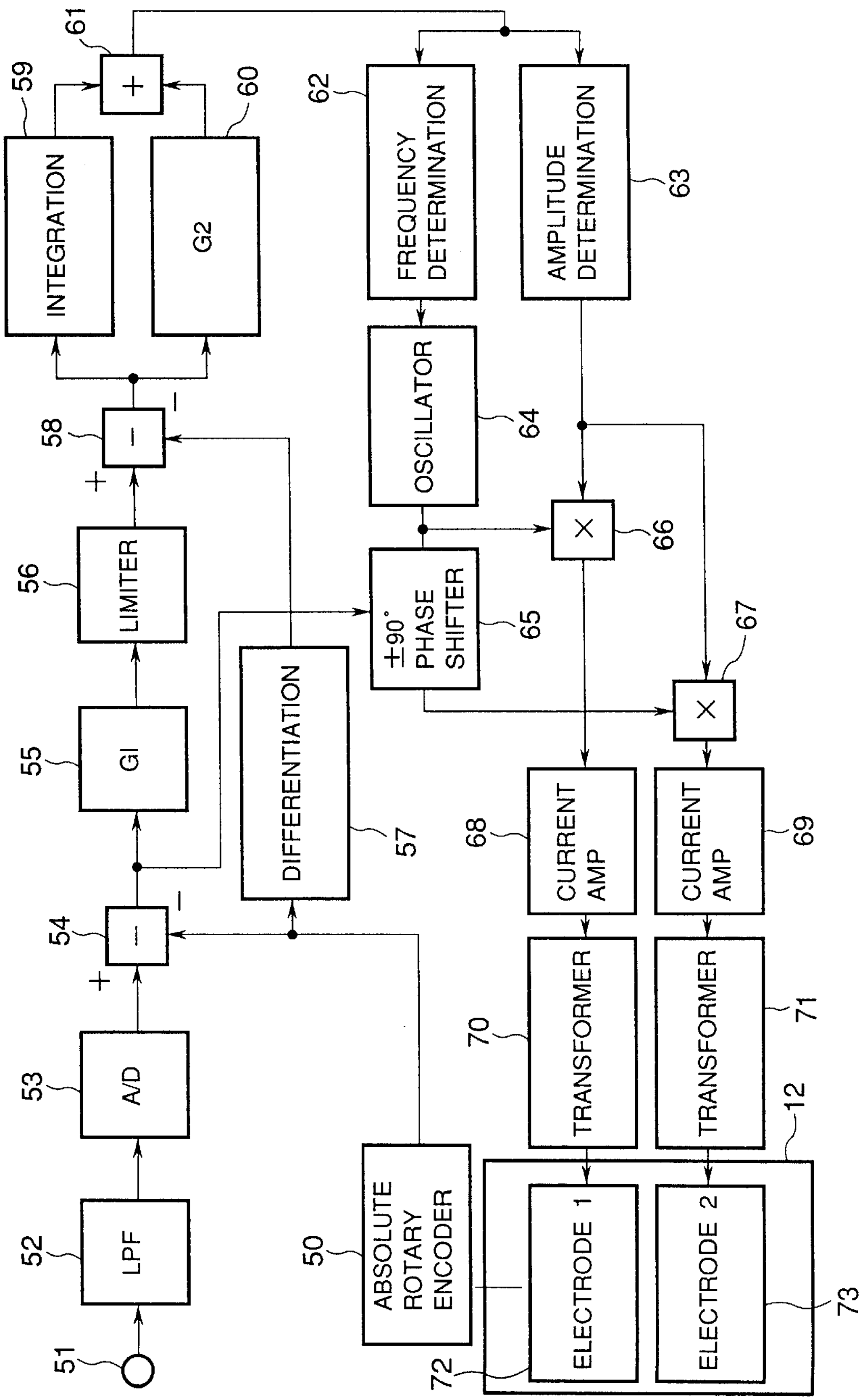
FIG. 4 shows a configuration of a drive circuit of the speaker of FIG. 2.

Referring to FIG. 4, details of the drive circuit 11 of FIG. 2 are explained. Numeral 51 denotes a terminal to which an analog audio signal from the audio amplifier 10 is supplied, and numeral 52 denotes a low-pass filter (LPF) for eliminating a high frequency component of the input audio signal. A cutoff frequency of the low-pass filter is set to approximately 200 Hz, for example. The cutoff frequency may be appropriately determined in accordance with the tracking of the supersonic wave motor and the filtering of the frequency components lower than a frequency sensible by human audible sense, of the phase information of the sound signal complies to the object of the speaker of the present invention, that is, the compensation of the group delay characteristic in the frequency lower than the human sensible frequency, of the phase information.

The low frequency audio signal outputted by the LPF 53 is supplied to an analog-digital (A/D) converter 53 and it is digitized at a frequency which is sufficiently higher than a Nyquist frequency at which a turn-over distortion does not occur. The number of quantumization bits is preferably 16 bits when matching with other equipment is taken into consideration.

On the other hand, numeral 50 denotes an absolute rotary encoder for detecting a rotation phase of the supersonic motor 12 and outputting a digital value of an absolute phase. For example, the output value thereof is set such that a free position of the diaphragm (a position of the diaphragm when it is assumed that the leaf spring 13 is not present) is zero. On the other hand, the sound signal is a signal which varies around zero amplitude. Thus, the position of the diaphragm corresponding to the zero amplitude is the free position.

The output of the encoder 50 and the output of the A/D converter 53 are supplied to a subtractor 54 which subtracts the output of the encoder 50 from the amplitude of the sound signal outputted from the A/D converter 54. Namely, the output of the subtractor 54 indicates a current phase difference from the target rotation phase of the supersonic wave motor (rotor), that is, the distance to drive the motor 12. An appropriate coefficient is multiplied to the output 54 of the subtractor by a coefficient circuit 55 to produce digital information corresponding to the rotating speed to drive the motor from a stop state to the desired rotation phase. Since there is a limit in the rotating speed of the supersonic wave motor, an upper limit of the digital value is limited by a limiter 56 such that the indicated rotating speed does not exceed maximum speed.

On the other hand, a most significant bit of the output of the subtractor indicates a positive or negative sign of the digital value and it is extracted as the information to indicate a drive direction and supplied to a phase shifter 65 to be described later. The phase information outputted by the encoder 50 is differentiated by a differentiation circuit 57 to produce the current rotating speed of the supersonic wave motor 12. Accordingly, the actual rotating speed outputted by the differentiation circuit 57 is subtracted from the target rotating speed outputted from the limiter 56 by the subtractor 58 to produce the required acceleration and the supersonic wave motor is driven in accordance with the output of the subtractor 58 so that the leaf spring of FIG. 2 is moved to the position which follows the sound signal.

In the embodiment shown in FIG. 2, the rotation motion of the supersonic wave motor 12 is transduced to the linear motion by the leaf spring 13. Thus, strictly speaking, the rotation phase of the supersonic motor must change non-linearly to the amplitude of the sound signal. In FIG. 2, since the stroke of the supersonic wave motor is sufficiently small and the leaf spring 13 is arranged along a tangential line to an outer periphery of the rotor of the motor, it is ignored.

However, where non-linear change is taken into consideration, it is necessary to convert the input sound signal non-linearly by using a look-up table (LUT). The conversion may be attained by arranging the LUT immediately following the A/D converter 53 or making the characteristic of the A/D converter 53 non-linear.

The output of the subtractor 58 is inputted to an integrator 59 and a coefficient circuit 60. By integrating the output of the subtractor 58 through the integrator 59, the fidelity of the low frequency response of the sound signal which is close to DC is attained and the stable limit is attained. By appropriately setting the coefficient of the coefficient circuit 60, the response to a relatively high frequency component may be adjusted. The output of the integrator 59 and the output of the coefficient circuit 60 are added by an adder 61 and a sum is supplied to a frequency determination circuit 62 for determining the frequency of the travelling wave to drive the supersonic wave motor and an amplitude determination circuit 63 for determining the amplitude of the travelling wave.

As disclosed in the Japanese Laid-Open Patent Application No. 59-156169, the supersonic wave motor is driven by supplying the travelling waves having the phase difference of 90 degrees therebetween two electrodes groups 72 and 73 of opposite polarities arranged alternately. The rotating speed of the motor is determined by the amplitude and the frequency of the travelling waves. Namely, the higher the frequency is, the lower the speed, and the larger the amplitude is, the higher the speed. Since the ranges in which the frequency and the amplitude can change are predetermined, the frequency and the amplitude of the travelling wave are determined by the circuits 62 and 63 such that they are complementarily controlled in a speed range in which the speed cannot be controlled by only one of them.

The digital frequency information from the frequency determination circuit 62 may be converted to a voltage to control an oscillation frequency of an oscillator which is a voltage controlled oscillator so that the oscillator 64 is oscillated at a desired frequency. The output of the oscillator 64 is supplied to a ±90° phase shifter 65 where the phase is shifted by 90°. Since the direction of rotation of the motor is determined by the direction of shift of the phase, the most significant bit of the subtractor 54 may be used as a control signal to determine the direction of phase shift.

The outputs of the oscillator 64 and the phase shifter 65 are inputted to multipliers 66 and 67, respectively, where the amplitude information determined by the amplitude determination circuit 63 is multiplied. Thus, since the supersonic wave motor is driven in accordance with the sound signal amplitude, the two-phase drive current having the phase, the frequency and the amplitude thereof controlled is applied to current amplifiers 68 and 69. The outputs of the current amplifiers 68 and 69 are applied to electrode groups 1 and 2 (72 and 73) of the opposite polarity arrange alternately on the stator, through transformers 70 and 71.

In the speaker system which uses the supersonic wave motor described above, various problems which are not solved by the prior art dynamic speaker using the voice coil can be radically solved. Namely, the problems which the prior art speaker potentially possesses, that is, the counter emf, the resonance phenomenon and the group delay characteristic do not take place and the adverse affect to the output sound due to those problems is avoided.

Modifications of the present invention are now discussed.

Figure 5:
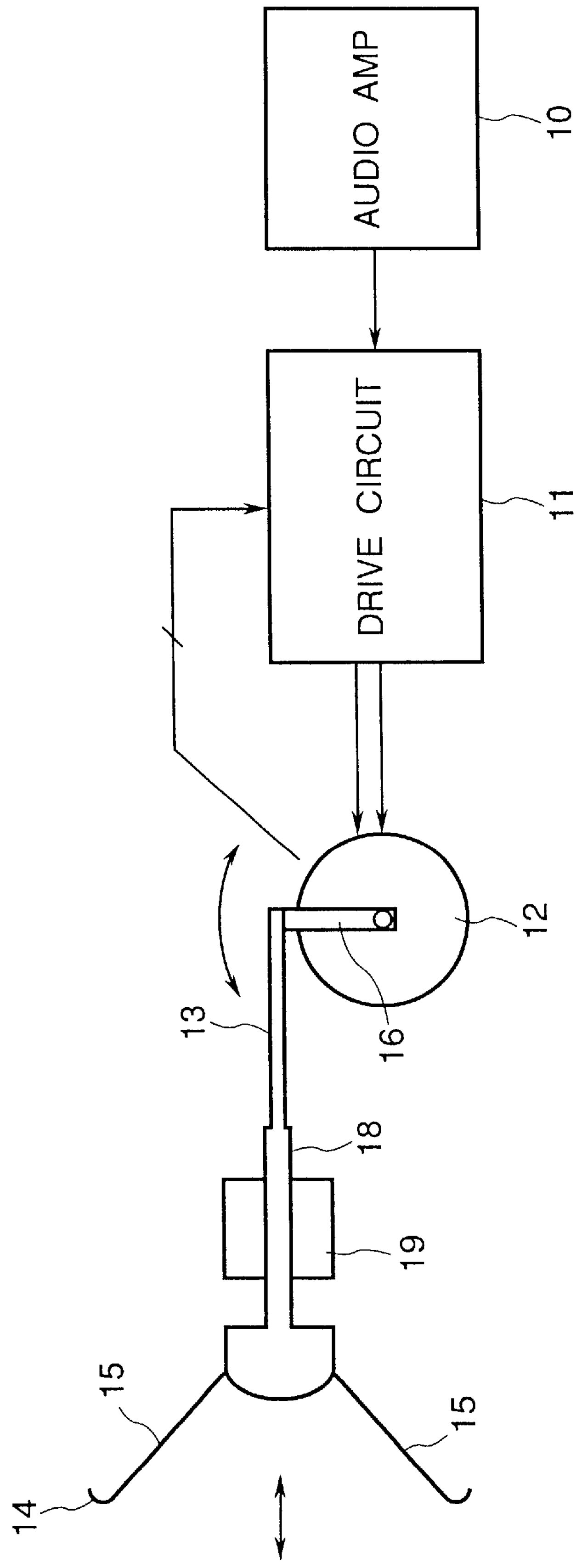
FIG. 5 shows a schematic construction of a speaker in accordance with another embodiment of the present invention.

FIG. 5 shows a speaker system in accordance with another embodiment of the present invention. The like elements to those shown in FIG. 2 are designated by like numerals. Numeral 18 denotes a bar connected to the leaf spring 13. The bar 18 is slidably arranged in a linear motion guide mechanism 19 and it is movable only perpendicularly to the diaphragm. By arranging such linear motion guide mechanism, unstable vibration of the diaphragm due to the flexure of the leaf spring 13 is prevented and higher fidelity sound reproduction is attained.

Figure 6:
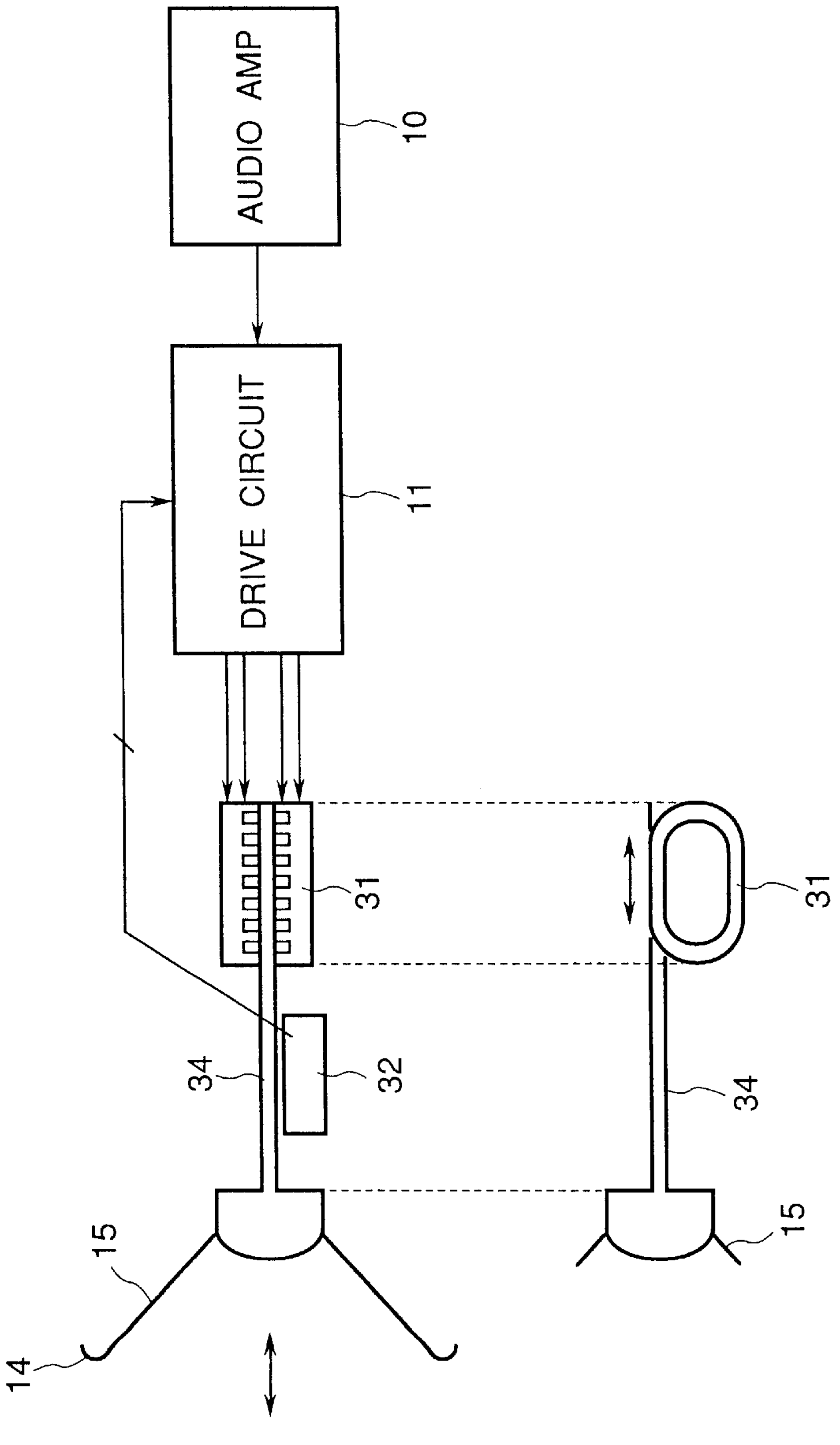
FIG. 6 shows a schematic construction of a speaker in accordance with a further embodiment of the present invention.

FIG. 6 shows a speaker system in accordance with another embodiment of the present invention. The like elements to those shown in FIG. 2 are designated by like numerals. Numeral 31 denotes a stator of the supersonic wave motor which is partially linear. A pair of stators are provided as shown and they are arranged to vertically hold a link 34 which serves as a moving member through an elastic member, not shown.

Figure 7:
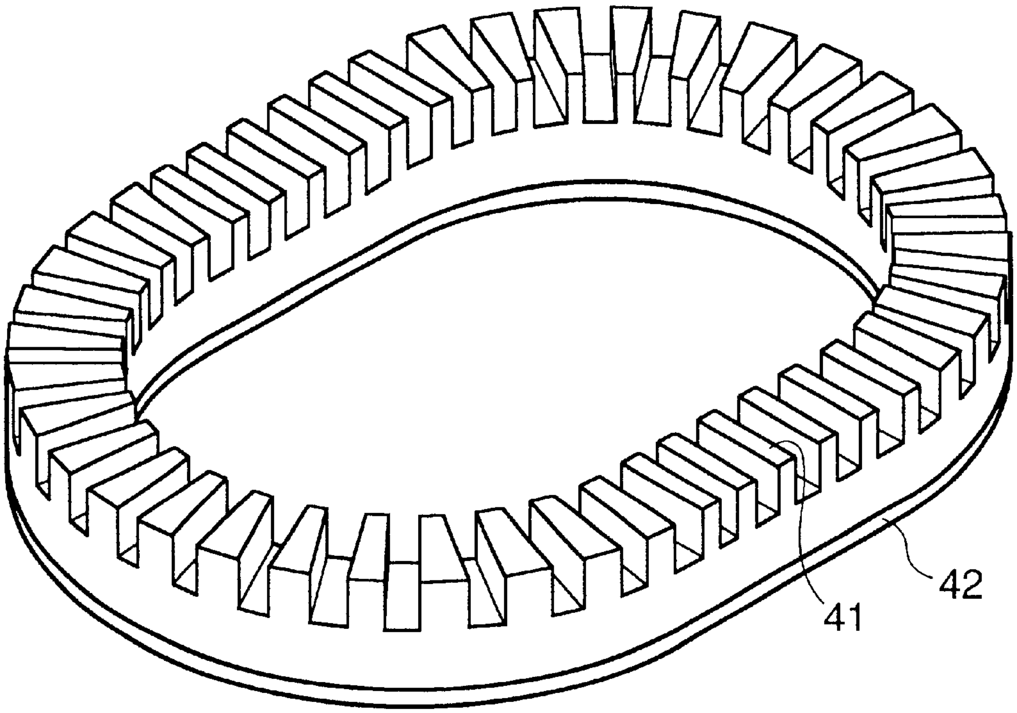
FIG. 7 shows a construction of a supersonic motor used in the speaker of FIG. 6.

Such stators are disclosed in Japanese Laid-Open Patent Application No. 3-289307 filed by the assignee of the present invention and the detailed explanation thereof is omitted, and a perspective view is shown in FIG. 7. Numeral 41 denotes a metal elastic member and numeral 42 denotes a piezo-electric ceramic. A lower drawing of FIG. 6 shows a sectional view of an upper drawing of FIG. 6. As shown, the link 34 is pinched by front portions of the stator 31 and the link 34 makes linear motion when the above travelling wave is applied to the electrode of the stator.

The linear motion is detected by a linear encoder 32 which feeds back the detection signal to the drive circuit 11 to drive the supersonic wave motor by the circuit shown in FIG. 4. The oscillation signals having 90 degrees phase difference therebetween outputted from the drive circuit are supplied to the upper and lower stators.

In the speaker systems explained with reference to FIGS. 6 and 7, it is not necessary to transduce the rotation motion to the linear motion and the loss due to the transform is smaller than that in the speaker of FIG. 2 and higher fidelity sound reproduction is attained.

In the above embodiments, the drive circuit is of hardware configuration although a portion or most of the circuit of FIG. 4 may be implemented by software. For example, in FIG. 4, the portion from the A/D converter 53 to the frequency and amplitude determination circuits 62 and 63 may be implemented by software.

The supersonic wave motor itself may be of one of various constructions and other constructions than those shown in FIGS. 2 and 7 may be applied to the present invention. For example, in the present embodiment, the travelling wave type vibration wave motor which is presently most popular is explained although the speaker of the present invention may use a standing wave type vibration wave motor. The features of the speaker which uses the ultrasonic wave motor of the construction described above are as follows. Namely, since the supersonic wave motor, usually the vibration wave motor drives the piezo-electric element in the supersonic range to impart the rotating or linear motion to the rotor or the movable element, no electric induction is present and the counter emf is not produced.

In the supersonic motor, the mass of the movable part is larger than that of the dynamic speaker. Because of a its construction and it is of contact type and has a large static friction resistance, the so-called lowest resonance frequency is not present. Accordingly, no resonance phenomenon nor the deterioration of the characteristic due to the resonance phenomenon takes place.

Further, the supersonic wave motor is basically of a voltage driven type and the various problems encountered in the dynamic speaker, that is, the group delay characteristic in which the reproduced sound is delayed more as the frequency is lower does not take place. This feature is very important to the object of high fidelity in which the original sound waveform is to be reproduced with high fidelity and such has been impossible to attain in principle in the prior art dynamic speaker. Accordingly, the predominance of the speaker which uses the supersonic wave motor is apparent.

In accordance with the speaker and the drive device for the speaker of the present invention, the diaphragm is driven by the supersonic wave motor which is driven by the travelling vibration wave. Accordingly, no counter emf is generated, no resonance phenomenon takes place and no group delay phenomenon is observed. The present invention particularly provides a speaker having a very excellent low frequency characteristic, that is, it provides a high fidelity speaker.

What is claimed is:

1. A speaker comprising:

inputting means for inputting a sound signal;

a diaphragm for outputting sound;

a supersonic motor having a mover and a stator, said stator including a piezo-electric material having a number of electrodes to which vibration wave signals are supplied to cause motion of said piezo-electric material, the motion of said stator being transmitted to said mover;

connecting means for connecting said mover to said diaphragm;

detection means for detecting a position of said mover so as to generate current position information;

differentiation means for differentiating the position information so as to generate current speed information;

comparison means for comparing the current position information and desired position information defined by the sound signal so as to operate a difference between the current position information and the desired position information corresponding to desired speed information in a digital form;

limiter means for limiting the difference in the digital form so that the desired speed information does not exceed a maximum speed of said supersonic motor for driving said diaphragm;

drive means for generating the vibration wave signals to drive said supersonic motor; and control means for controlling an amplitude and a frequency of the vibration wave signals in accordance with a difference between the current speed information and the desired speed information limited by said limiter means.

2. A speaker according to claim 1, wherein rotating motions are generated between said stator and said mover, and said connecting means transduces the rotating motions to linear motions and transmits the linear motions to said diaphragm.

3. A speaker according to claim 1, wherein linear motions are generated between said stator and said mover, and said connecting means transmits the linear motions to said diaphragm.

4. A speaker according to claim 1, wherein said mover and said stator are ring-shaped and said stator is formed by a piezo-electric ceramic and a metal ring.

5. A speaker according to claim 4, wherein said piezo-electric ceramic has a linear portion which generates linear motions.

6. The speaker according to claim 1, wherein said control means includes integration means for integrating the difference between the current speed information and the desired speed information so as to make a response to a low frequency component of the sound signal diligent.

7. A speaker comprising:

inputting means for inputting a sound signal;

a diaphragm for outputting sound;

a supersonic motor having a mover and a stator, said stator including a piezo-electric material having a number of electrodes to which vibration wave signals are supplied to cause motion of said piezo-electric material, the motion of said stator being transmitted to said mover, connecting means for connecting the mover to said diaphragm;

drive means for generating the vibration wave signals to drive said supersonic motor;

forming means for forming acceleration information, said forming means including means for detecting a position of said mover so as to generate current position information, means for differentiating the position information so as to generate current speed information, means for comparing the current position information and desired position information defined by the sound signal so as to operate a difference between the current position information and the desired position information corresponding to desired speed information in a digital form, means for limiting the difference in the digital form so that the desired speed information does not exceed a maximum speed of said supersonic motor for driving said diaphragm, and means for comparing the current speed information and the desired speed information limited by said limiter means so as to generate the acceleration information; and control means for controlling the vibration wave signals in accordance with the acceleration information.

8. The speaker according to claim 7, wherein said limiting means limits the acceleration information.

9. The speaker according to claim 7, wherein said control means includes integration means for integrating the acceleration information so as to make a response to a low frequency component of the sound signal diligent.

* * * * *